(12) United States Patent
Ng et al.

(10) Patent No.: US 7,633,092 B2
(45) Date of Patent: Dec. 15, 2009

(54) OMNI-DIRECTIONAL LED LIGHT SOURCE

(75) Inventors: Kee Yean Ng, Penang (MY); Tajul Arosh Baroky, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 596 days.

(21) Appl. No.: 11/509,852

(22) Filed: Aug. 25, 2006

(65) Prior Publication Data

US 2008/0048198 A1 Feb. 28, 2008

(51) Int. Cl.
*H01L 27/15* (2006.01)
*H01L 31/12* (2006.01)
*H01L 33/00* (2006.01)

(52) U.S. Cl. .................... 257/79; 257/98; 257/E33.001
(58) Field of Classification Search ............ 257/79, 257/80, 81, 98, E33.001, E33.061
See application file for complete search history.

(56) References Cited

U.S. PATENT DOCUMENTS

2005/0083689 A1* 4/2005 Park ........................ 362/237

* cited by examiner

*Primary Examiner*—Hoai v Pham

(57) ABSTRACT

A light emitting diode ("LED") device that emits omni-directional light is disclosed. Such omni-directional LED device may include a LED chip capable of emitting light in all directions. In one example of one implementation, the LED chip is then assembled and sealed inside a casing, such as a glass casing or tube that is capable of emitting light in 360 degree beam pattern. Further, the anode and cathode, or P or N-type contacts, may be configured on the LED chip such that light is allowed to emit from the top and/or the bottom surface of the LED chip in the LED device and is further able to reflect outward and fill the casing or tube of the LED device with light capable of emitting omni-directionally.

17 Claims, 6 Drawing Sheets

OMNI-DIRECTIONAL LED LIGHT SOURCE

BACKGROUND OF THE INVENTION

Light emitting diodes ("LEDs") are, in general, miniature semiconductors that employ a form of electroluminescence resulting from the electronic excitation of a semiconductor material, which produces visible light. Initially, the use of LEDs was limited mainly to display functions on electronic appliances and the colors emitted were red and green. As the technology has improved, LEDs have become more powerful and available in a wide spectrum of colors.

As LEDs have become more powerful, they have also become smaller, brighter, more efficient and less expensive. LEDs are now found in an ever increasing number of applications. With the increasing capabilities of LEDs, a possibility now exists for using LEDs for illumination in generally conventional lighting applications. The advantages of using LEDs for illumination is that they are far more efficient than conventional lighting, are rugged and very compact, and can last much longer than incandescent or fluorescent light bulbs or lamps. However, one disadvantage of using LED devices in general conventional lighting application is that LED devices are generally directional light emitters.

FIG. 1 illustrates the cross-sectional structure of a typical LED device 100. The LED device 100 is provided with a mount lead 102 and an inner lead 104. The mount lead 102 also includes a reflector cup 106 or an opaque substrate, in which a light emitting diode or LED chip 108 is affixed. An n electrode and a p electrode of the light emitting diode 108 are connected to the mount lead 102 and the inner lead 104 by bonding wires 110 and 112, respectively. The whole assembly is encapsulated in a clear encapsulate 114. In operation, the LED 102 emits directional light upward 116, toward the top of the LED device 100.

In practice, most light 116 in LED devices 100 are emitted from the top surface and the four side surfaces of the LED chip 108. Almost no light is emitted from the bottom surface of the LED chip 108 after it is packaged into an LED device 100, as shown in FIG. 1. This is because the reflector cup 106 or opaque substrate located on the mount lead 102 of the LED device 100 blocks all the light on the bottom surface of the LED 108 and generally reflects the light 116 from the four sides of the LED chip 108 upward. Accordingly, in prior art LED devices 100, light 116 is emitted only in the forward hemisphere of the LED device 100. In that respect, a LED device 100 is considered a directional emitter, having a beam pattern typically of 120 degrees or less.

In other prior art LED devices, the LED chip is assembled inside a reflector-like cavity that serves to collect all the four side lights and reflect them towards the top direction, thus making the LED device even more directional. The beam pattern of this type of LED device is typically not more than 60 degrees.

While LEDs offer many advances over conventional lighting, many generally lighting applications utilize omni-directional light sources, i.e., a light source capable of emitting light in all directions (360 degrees). Since typical LED devices only emit light in one direction, the use of LED devices for illumination in general lighting applications is limited. A need therefore exists for a LED device designed to allow the light from an LED to be emitted omni-directionally, thereby increasing the application of LEDs in general lighting applications or other application in which omni-directional lighting is desired or useful.

SUMMARY

A light emitting diode ("LED") device that emits omni-directional light is disclosed. Such omni-directional LED device may include a LED chip having a P-N junction positioned to emit light in all directions. The LED chip is then assembled and sealed inside a casing, such as a glass casing or tube, that is designed to emit light in a 360 degree beam pattern.

An example of one implementation of an LED chip that is designed to emit light in all directions may include a first layer doped to a certain polarity, a P-N junction and a second layer doped to a polarity reversed to the first layer. Where the substrate is optically transparent, light generated in the P-N junction may exit the LED chip from all surfaces, i.e., top, bottom and four sides surfaces. Further, the anode and cathode, or P or N-type contacts, may be configured in the LED device such that light is allowed to emit from the top and/or the bottom surface of the LED chip and reflect outwardly to fill the casing or tube of the LED device with light capable of emitting omni-directionally.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

In the following description, reference is made to the accompanying drawings that form a part of the description, and which show, by way of illustration, a specific embodiment in which the invention may be practiced. Other embodiments may be utilized and structural changes may be made without departing from the scope of the invention.

Figure 2:
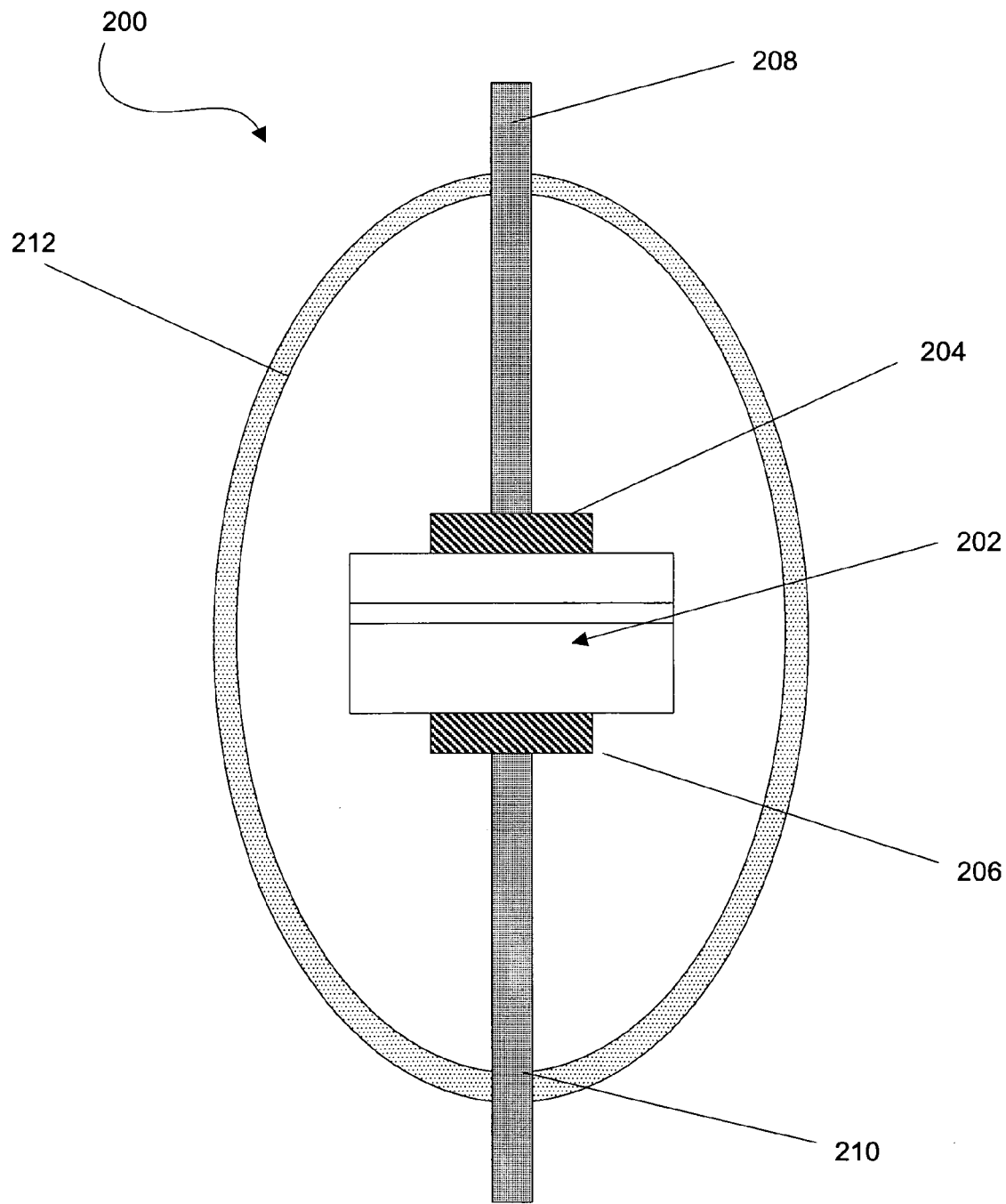
FIG. 2 illustrates an example of one implementation of an omni-directional LED device.

FIG. 2 illustrates an example of one implementation of an omni-directional LED device 200. As illustrated in FIG. 2, the LED device 200 includes an LED chip 202, having an anode lead 204 and a cathode lead 206. The anode lead 204 and cathode lead 206 may be constructed from any conductive material, such gold-zinc (Au—Zn), nickel-gold (Ni—Au) or aluminum (Al), as examples, and generally takes the form of an opaque substrate. The anode lead 204 is connected to terminal 208 and the cathode lead 206 is connected to terminal 210. The LED assembly is then sealed in a casing 212, such that the terminals 208 and 210 extending from the LED chip 202 projected outward from the casing 212. The casing 212 may be a glass casing or other casing made from any other suitable material that will allow light to be emitted 360 degrees about the LED chip 202, giving the LED device 200 an omni-directional beam pattern. The casing may be filled with air, inert gas or vacuum, or other suitable gas, or be inorganic or organic materials, for example, silicone, which may help to remove heat generated by the operation of the LED device 200. Alternately, the casing may be fabricated in the form of a tube comprising an encapsulated material made from organic material or inorganic material, for example, silicone material. Further, a wavelength converting material may be dispersed inside the casing or embedded in the encapsulated tube. The wavelength converting material absorbs at least a portion of the light emitted by the LED chip 202 and then emits a second wavelength. In one example of an implementation, the LED chip 202 emits blue light while a yellow phosphor material is employed as the wavelength converting material. In this arrangement, blue light from the LED chip 202 and the yellow light emitted by the phosphor will appear white to an observer. An example of the phosphor that may be utilized is Yttrium Aluminium Garnet activated by Cerium (YAG:Ce).

To facilitate light from the LED chip 202 to be emitted in 360 degrees, an LED chip 202 capable of emitting light from its top, bottom and all four sides may be utilized in connection with a omni-directional LED device, such as the LED device 200 illustrated in FIG. 2. To achieve an omni-directional beam pattern, the size of the anode and cathode, and/or terminals, may be designed such that the anode and cathode do not cover the entire top and/or bottom portion of the LED chip, thereby allowing light to be emitted from the top and bottom surfaces of the LED chip. While the configuration of the LED device may still allow for the LED device to emit omni-directional light when the terminals at the end of the LED chip do not allow light to emit from the top and bottom surfaces of the LED chip, the efficiency of the LED device may be improved by designing the terminals in contact with the LED chip to allow light to be emitted from the top and bottom surfaces of the LED chip.

Figure 1:
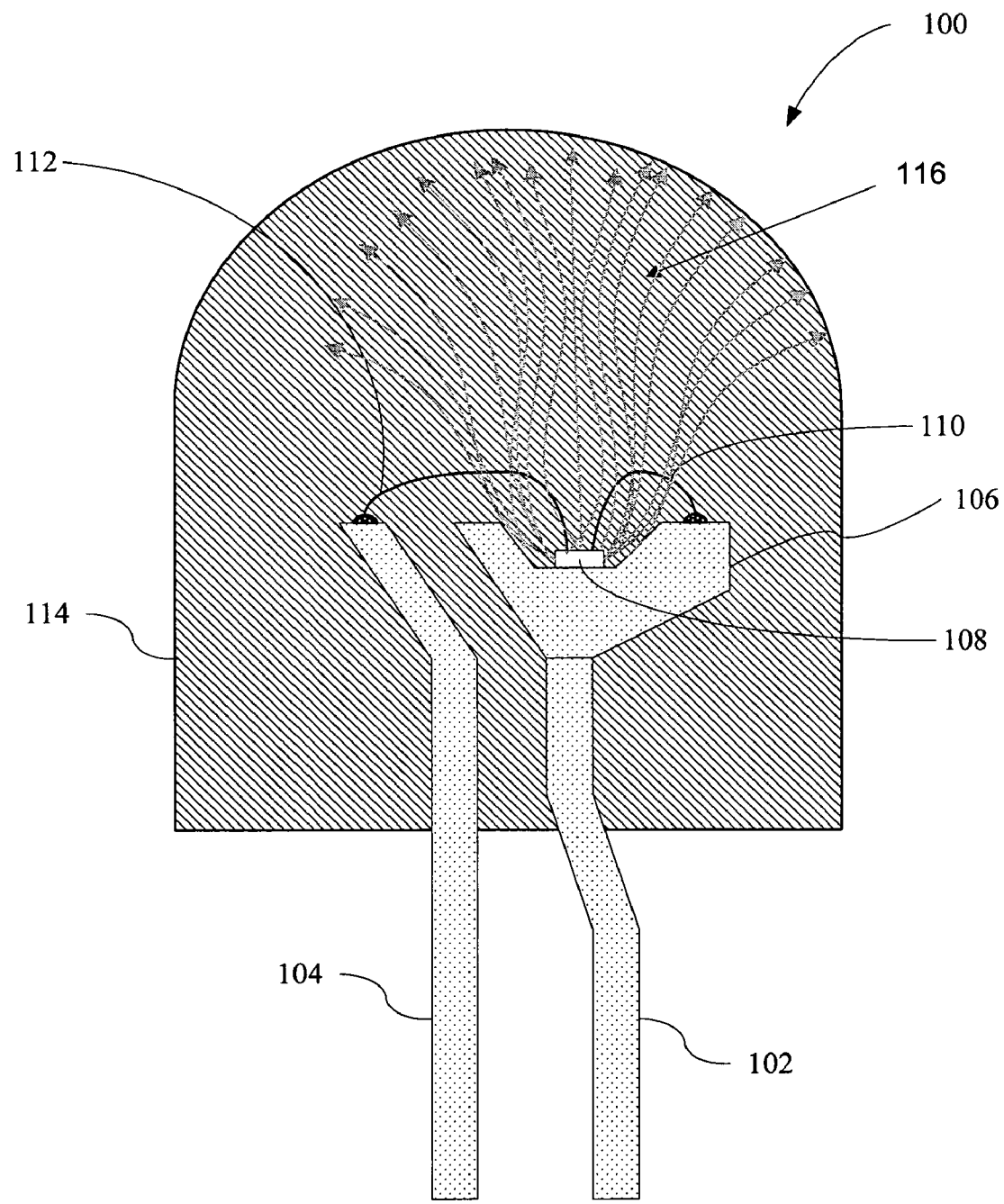
FIG. 1 illustrates a prior art light emitting diode ("LED") device.

Alternatively, by using brighter, more efficient LED chips that are currently available, or that may become available, it may not be necessary to utilize an LED chip that allows for light to emit from the top and/or bottom surfaces of the LED chip. The more bright and efficient the LED chip, the more likely that an omni-directional beam pattern may be achieved from the light being emitted from all four sides of the LED chip, provided, that the configuration of the LED chip in the LED device allows for the light to be emitted outward from the sides of the LED chip and is not reflected upward, as with traditional LED devices (FIG. 1). Alternatively, an LED chip which emits light substantially from the sides can be used. Such a chip can be fabricated as needed.

While, depending upon the application, the terminals may need to be sized to allow light to be emitted from the top and/or bottom of the LED chip 202, the design of the terminal size may also account for heat dissipation via the two terminals 208 and 210. Accordingly, the two terminals 208 and 210 may be sized to be efficient heat removers. To also assist with heat removal, in one example embodiment, as previously stated, the casing or tube 212 may be filled with air, inert gas or vacuum, or other suitable gas, or be inorganic or organic materials, for example, silicone, which may also function to assist with dissipating heat generated by the operation of the LED device 200.

Figure 3:
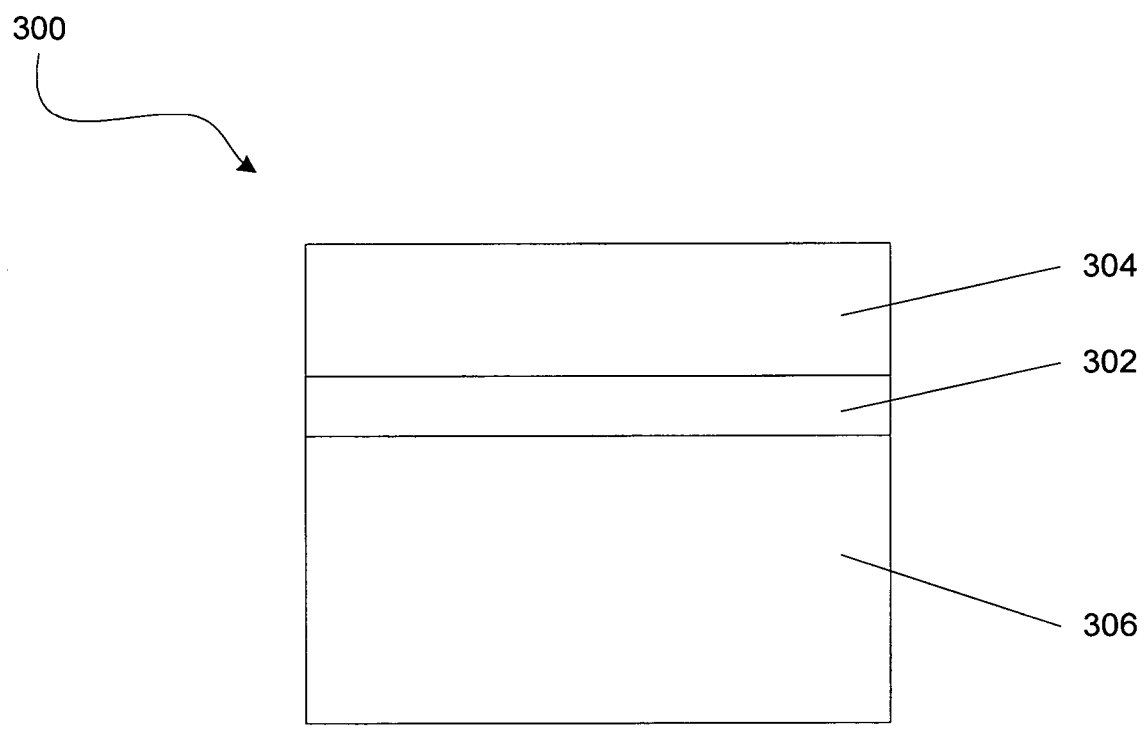
FIG. 3 illustrates an example of one implementation of an LED chip that may be utilized in connection with the omni-directional LED device of FIG. 2.
Figure 4:
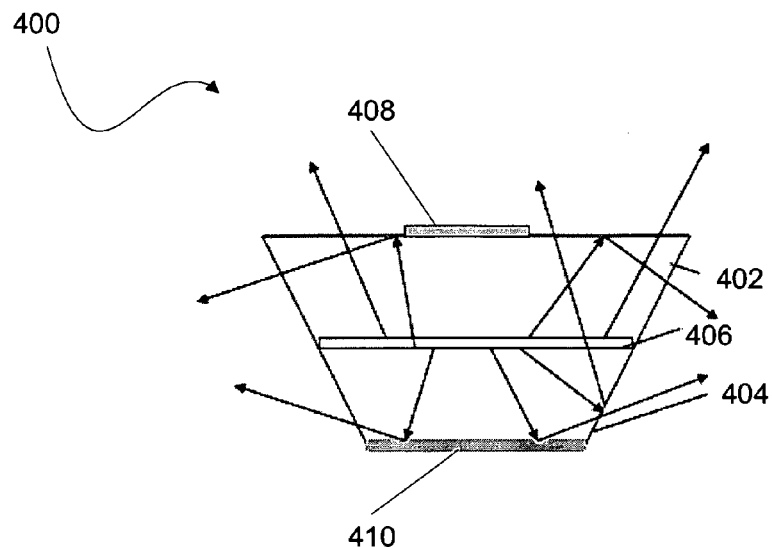
FIG. 4 illustrates another example of one implementation of an LED chip that may be utilized in connection with the omni-directional LED device of FIG. 2.
Figure 5:
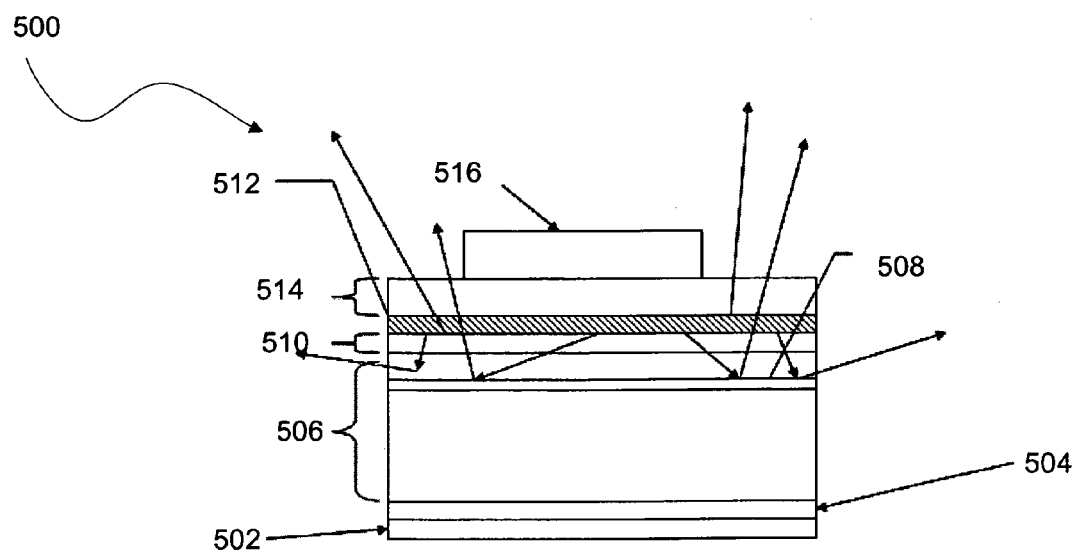
FIG. 5 illustrates yet another example of one implementation of an LED chip that may be utilized in connection with the omni-directional LED device of FIG. 2.

A few examples of LED devices that may be utilized in connection with an omni-directional LED device, such as the LED device 200 illustrated in FIG. 2, are described in FIGS. 3-5. Those skilled in the art will, however, recognize that any LED chip capable of emitting light from its top, bottom and all four sides may be utilized in connection with an omni-directional LED device, as well as certain bright, high efficiency LED chips that are capable of emitting a sufficient amount of light from all four of its sides and/or at least one top or bottom surface. Additionally, an LED chip that emits substantially from all four sides may be utilized in connection with an omni-directional LED device.

FIG. 3 illustrates an example of one implementation of an LED chip 300 that may be utilized in connection with the omni-directional LED device 200 of FIG. 2. As illustrated in FIG. 3, the LED chip 300 has a P-N junction 302 that emits light in all directions, i.e., isotropic radiator. As illustrated in FIG. 3, the LED chip 300 may have a first layer 304 doped to a certain polarity, such as a P-doped layer, which may be of a positive polarity and a second layer 306 doped to a certain polarity, such as a N-doped layer, which may be of a negative polarity (which is a reversed polarity to the first layer 304 regardless of the actual polarity of the first and second layers). In between the first layer 304 and the second layer 306 is a P-N junction 302. The first layer 304 is often called the substrate. Although the LED chip 302 illustrated in FIG. 3 has a first layer 304 of a positive polarity and a second layer 306 of a negative polarity, those skilled in the art will recognize that the polarities of the first and second layers 304 and 306 may be reversed depending on the design of the LED chip 300.

In the illustrated example, the substrate is optically transparent, and therefore, light generated in the P-N junction 302 exits the LED chip 300 from all surfaces (top, bottom and 4 sides surfaces). Thus, an LED chip 300 operates as an omni-directional radiator.

FIG. 4 illustrates another example of one implementation of an LED chip 400 that may be utilized in connection with the omni-directional LED device 200 of FIG. 2. FIG. 4 illustrates a LED chip 400 that is often referred to as a Truncated Inverted Pyramid (TIP) AlInGaP/GaP LED, or TS AlInGaP. This type of LED chip 400 is generally known for its enhanced light extraction efficiency.

As illustrated in FIG. 4, the LED chip 400 consists of a N-GaP layer 402 and a P-GaP layer 404 separated by an active substrate light emitting junction 406. The top N-GaP layer 402 is designed to be wider than the bottom P-GaP layer 404 giving the chip an inverted pyramid shape.

In the illustrated example, the cathode lead or N-type contact 408 is secured to the top N-GaP layer 402. The N-type contact 408 in this illustration does not extend entirely across the too of the N-GaP layer 402, thereby allowing light from the LED chip 400 to emit upward, as shown by the reflective arrows representing light emission. In contrast, the anode lead or P-type contact 410 is secured to the bottom P-GaP layer 404. In this example, the P-type contact 410 extends across the entire bottom portion of the P-GaP layer 404, thereby preventing light from emitting from the bottom layer of the LED chip. Although not necessary to create an omni-directional light source using an AlInGaP/GaP type LED chip due to the enhanced light emission of this type of LED chip 400, those skilled in the art will recognize that the configuration of this LED chip 400 may be modified such that the P-type contact does not extend across the entire bottom layer 404 of the LED chip 400 so that light can be emitted from the bottom of the LED chip 400. Further, although the LED chip 400 illustrated in FIG. 4 has a first layer 402 of a negative polarity and a second layer 404 of a positive polarity, those skilled in the art will recognize that the polarities of the first and second layer 402 and 404 may be reversed depending on the design of the LED chip 400.

Although an LED chip with transparent substrate such as LED 400 is described, an LED chip with absorbing substrate may also be used. In this case, a reflector mirror layer may be placed before the surface of the absorbing substrate to reflect light that would otherwise be absorbed by the absorbing substrate.

FIG. 5 illustrates yet another example of one implementation of an LED chip 500 that may be utilized in connection with the omni-directional LED device 200 of FIG. 2. FIG. 5 shows a P-up type die configuration of a deep UV light-emitting device utilized to produce white light. In this example illustration, a layer 502 is composed of N-type contact material, which may be composed of gold-zinc (Au—Zn). Layer 504 may consist of a buffer tie layer. Layer 506 may be, for example, an N-doped layer consisting of gallium-nitride (GaN) and may be, for example, approximately 75 to 180 micrometers (um) thick. Layer 508 may form a Bragg refractor and may be approximately 1.5 to 2.0 nanometers (nm) thick. Layer 510 may consist, for example, of an N-doped layer of GaN and may be approximately 15 to 20 um thick. Layer 512 may be, for example, an active layer that is approximately 2 to 20 nanometers thick. Layer 514 may be, for example, a P-doped layer of GaN of approximately 30 to 50 um thick. Lastly, layer 516 may be composed of P-contact metal such as nickel-gold (Ni—Au) or aluminum (Al). The arrows of FIG. 5 illustrate the light paths of the LED chip 500.

Figure 6:
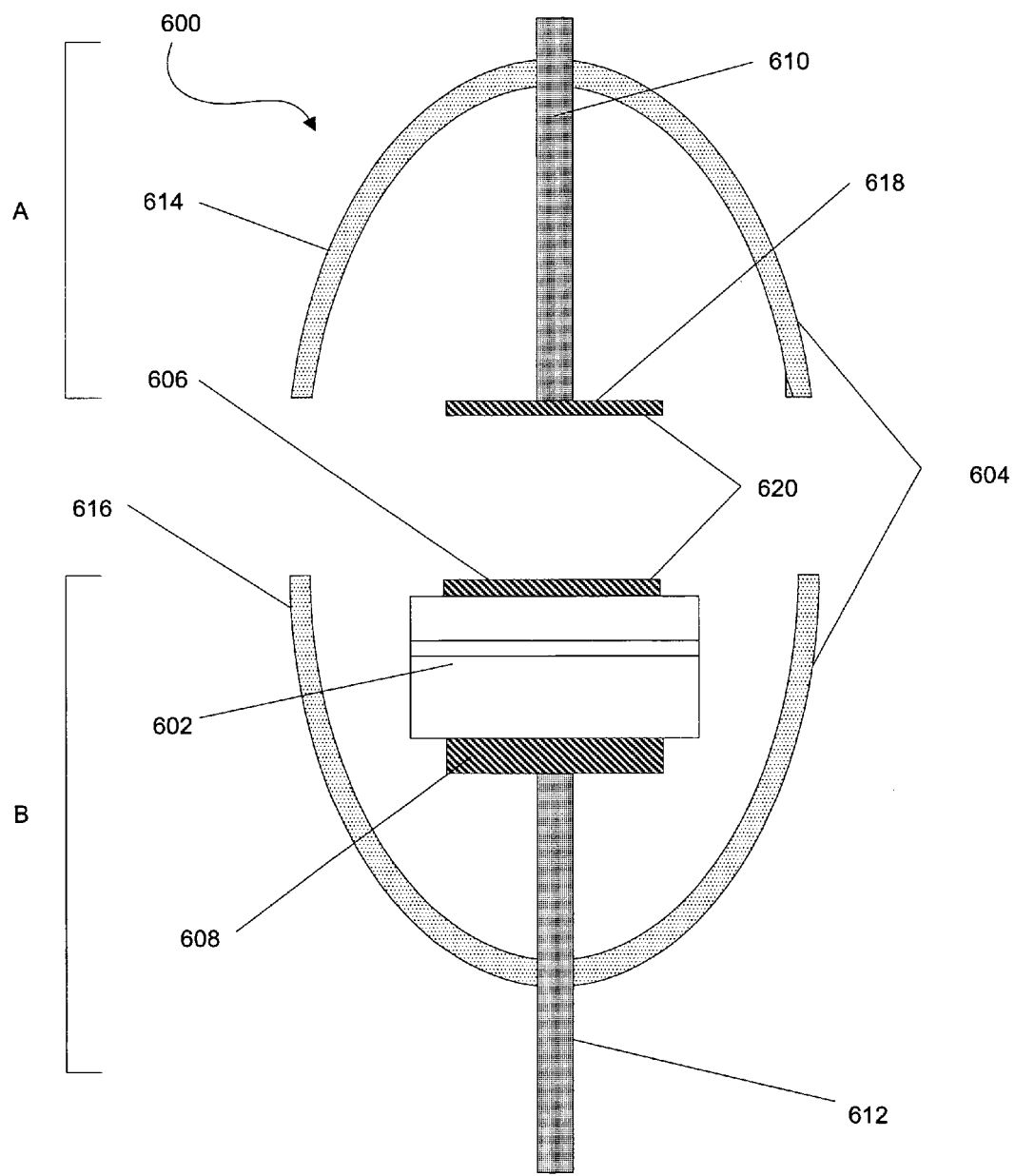
FIG. 6 illustrates one example of the assembly of the omni-directional LED device illustrated in FIG. 2.

FIG. 6 illustrates one example of the assembly of the omni-directional LED device 200 illustrated in FIG. 2. In the illustrated example, the LED device 600 is assembled from the fusion of two portions—terminal portion A & terminal portion B. Terminal portion A may include (i) a top portion 614 of the casing 604, (ii) terminal 610 and (iii) a first portion 618 of the anode lead 620. Terminal portion B may include (i) a bottom portion 616 of the casing 604, (ii) a second portion 606 of the anode lead 620, (iii) the LED chip 602, (iv) the cathode lead 608 and (v) terminal 612.

During assembly, terminal portion A & terminal portion B may be aligned and placed in a furnace that fuses the top portion 614 of the casing 604 with the bottom portion 616 of the casing 604. Although the illustrated example is described as the anode lead 620 being assembled from two portions 618 and 606, the cathode lead 608 may also be assembled from two portions. Further, the positioning of the anode and cathode leads 620 and 608, respectively, may be reversed depending upon the polarity of the layers of the LED device.

Figure 7:
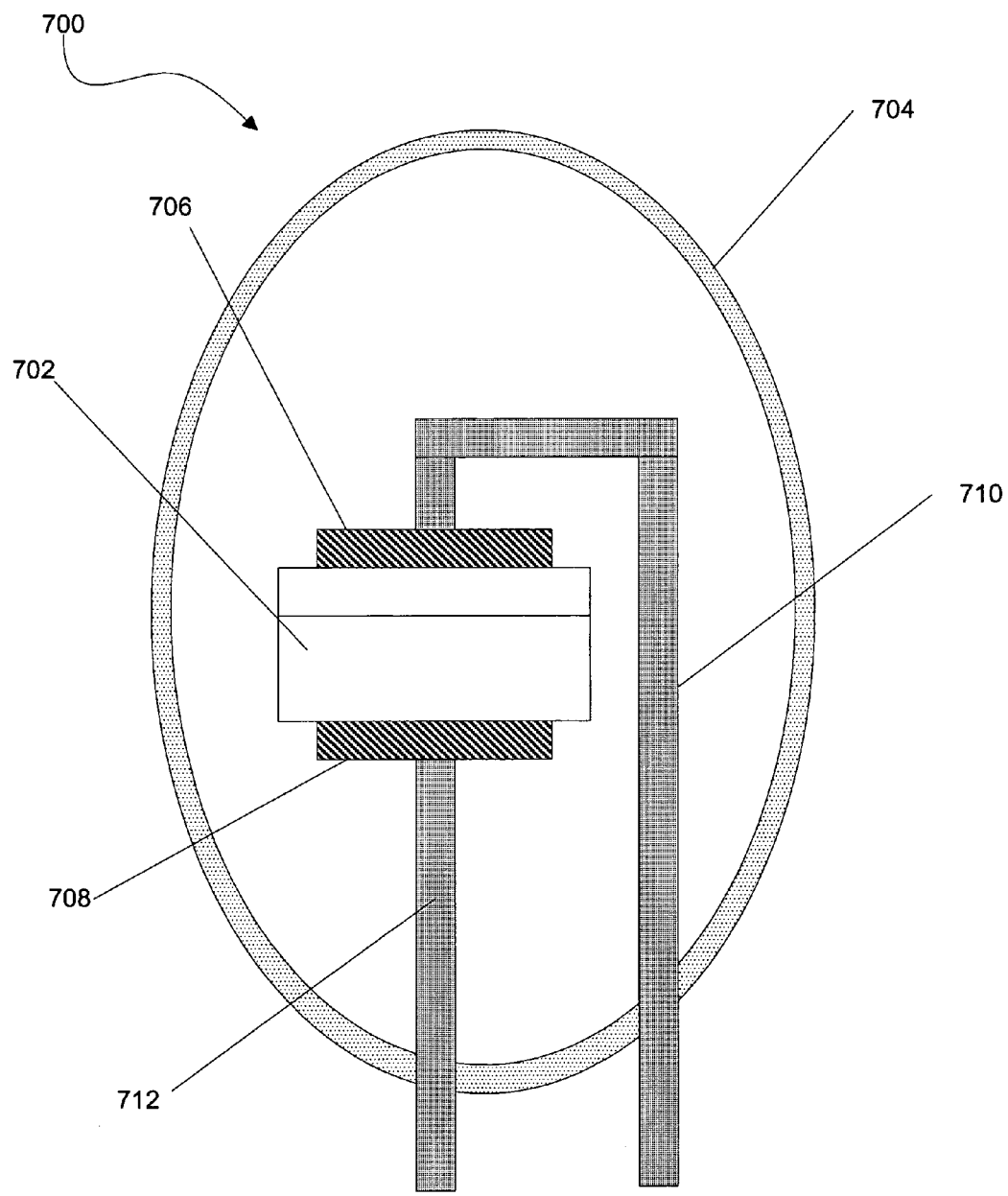
FIG. 7 illustrates another example of an implementation of an omni-directional LED device.

FIG. 7 illustrates another example of an implementation of an omni-directional LED device 700. Similar to the LED device 200 illustrated in FIG. 2, the LED device 700 includes an LED chip 702 sealed in a casing or tube 704, which may be made of glass or other suitable material that will allow light to be emitted from the LED chip 702 in an omni-directional beam pattern. The LED chip 702 has an anode lead 706 and a cathode lead 708. The anode lead 706 and cathode lead 708 may be constructed from any conductive material, such as gold-zinc (Au—Zn), nickel-gold (Ni—Au) or aluminum (Al), as examples, which generally takes the form of an opaque substrate. The anode lead 706 is connected to terminal 710 and the cathode lead 708 is connected to terminal 712. The entire assembly is then sealed in the casing 704, which may be filled with air, inert gas or vacuum, or other suitable gas, or be inorganic or organic materials, for example, silicone, which may help to dissipate heat generated by the operation of the LED device 700.

In the illustrated example in FIG. 7, unlike FIG. 2, the terminals 710 and 712 are arranged to extend outward beyond the casing 704 on the same side or end of the casing 704, unlike the terminals 208 and 210 in FIG. 2, in which the terminals exit the casing 212 at opposing ends of the casing 212. Those skilled in the art will recognize that the terminals 710 and 712 can be designed to exit the casing at any position suitable for the particular application of an LED device 700.

Further, the horizontal section of terminal 710 may not be of the same construction as the vertical section. For example, the horizontal section may be a wire bond made by bonding a wire between terminal 706 and the vertical section of 710.

In the previous discussion, a casing is described. Alternatively, the casing can be made of a single solid material such as an encapsulation. For example, the casing could be a tube of encapsulate silicone or epoxy.

It will be understood that the foregoing description of various implementations has been presented for purposes of illustration and description. It is not exhaustive and does not limit the claimed inventions to the precise forms disclosed. Modifications and variations are possible in light of the above description or may be acquired from practicing the invention. The claims and their equivalents define the scope of the invention.

What is claimed is:

1. A light-generating device comprising:
    a light emitting diode ("LED") chip having a first surface and second opposing surface;
    an anode secured to the first surface;
    a cathode secured to the second surface;
    a first terminal extending from the anode;
    a second terminal extending from the cathode;
    a casing entirely encapsulating the LED chip, anode, cathode and at least a portion of the first terminal and at least a portion of the second terminal, except that portions of the first and second terminals are allowed to extend outward beyond the exterior circumference of the casing; and
    whereby the anode and cathode are secured to the first and second surface of the LED chip such that light from the LED chip is able to produce an omni-directional beam pattern when encapsulated in the casing.

2. The light generating device of claim 1 wherein the casing is made of glass.

3. The light generating device of claim 1 wherein the casing is filled with air.

4. The light generating device of claim 1 wherein the casing is filled with vacuum.

5. The light generating device of claim 1 wherein the casing is filled with an inorganic material.

6. The light generating device of claim 1 wherein the casing is filled with an organic material.

7. The light generating device of claim 1 wherein the casing is filled with silicone.

8. The light generating device of claim 1 wherein the casing is an encapsulated body.

9. The light generating device of claim 1 wherein the anode is secured to the first surface such that the anode leaves surface area on the first surface exposed to allow light from the LED chip to be emitted from the first surface of the LED chip.

10. The light generating device of claim 1 wherein the cathode is secured to the second surface such that the cathode leaves surface area on the second surface exposed to allow light from the LED chip to be emitted from the second surface of the LED chip.

11. The light generating device of claim 1 wherein the first terminal and second terminal extend outward beyond the casing at opposing ends of the casing.

12. The light generating device of claim 1 wherein the first terminal and second terminal extend outward beyond the casing at the same end of the casing.

13. The light generating device of claim 1 wherein the LED chip has a transparent substrate.

14. The light generating device of claim 1 wherein the LED chip has an absorbing substrate.

15. The light generating device of claim 1 wherein the LED chip emits light of a first wavelength and the casing comprises a wavelength converting material.

16. The light generating device of claim 15 wherein the first wavelength is a wavelength less than 500 nm.

17. The light generating device of claim 15 wherein the wavelength material emits a wavelength more than 520 nm.

* * * * *